United States Patent
Suzuki et al.

(10) Patent No.: US 6,414,867 B2
(45) Date of Patent: Jul. 2, 2002

(54) POWER INVERTER

(75) Inventors: Osamu Suzuki, Chiyoda; Heikichi Kuwabara, Tsuchiura; Akio Yasukawa, Kashiwa; Mitsuyuki Hombu, Hitachinaka; Hirohisa Yamamura, Hitachioota; Sanshirou Obara, Toukai; Kaname Sasaki, Hitachinaka, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/784,117

(22) Filed: Feb. 16, 2001

(30) Foreign Application Priority Data

Feb. 16, 2000 (JP) .......................... 2000-043519

(51) Int. Cl.7 ............................ H02M 1/00; H05K 7/20
(52) U.S. Cl. ........................................ 363/141; 361/709
(58) Field of Search ................................. 363/141, 142, 363/143; 361/709, 676, 688, 699, 701

(56) References Cited

U.S. PATENT DOCUMENTS 5,631,821 A * 5/1997 Muso ........................ 363/141
5,966,291 A * 10/1999 Baumel et al. ............. 361/707
6,166,937 A * 12/2000 Yamamura et al. ......... 363/141

* cited by examiner

*Primary Examiner*—Rajnikant B. Patel
(74) *Attorney, Agent, or Firm*—Antonelli, Terry, Stout & Kraus, LLP

(57) ABSTRACT

A heat sink or cooling case has a cooling channel and at least one opening formed to face part of the channel. A first seal is provided outside the at least one opening. A cooling case has a groove located outside the first seal. Holes are discretely formed in the groove and lead from the groove to an exterior of the cooling case. A second seal is provided outside the groove. A radiating plate constituting a circuit case is mounted on the heat sink by using a clamping device inside or outside the second seal.

5 Claims, 6 Drawing Sheets

FLOW OF COOLING LIQUID

POWER INVERTER

BACKGROUND OF THE INVENTION

The present invention relates to a power inverter and in particular, to a power inverter for electric vehicles or hybrid cars equipped with a plurality of components such as an engine, a revolving apparatus and the like, which are required to be small and light.

A conventional power inverter is disclosed, for example, in the specification of JP-A-11-163572. In this power inverter, a circuit case for accommodating a substrate having circuit elements mounted thereon is formed with a window for exposing the substrate, and an opening of a cooling case (opening for contact cooling) is closed by a surface portion of the substrate which is exposed from the window and is the reverse of the substrate surface on which the circuit elements are mounted. This specification further discloses a configuration in which a contact area (circuit-case side contact area) between the circuit case surrounding the substrate exposing window and the reverse surface of the substrate is arranged in such a manner that a liquid releasing gap in communication with an exterior is located between the above contact area and a contact area (cooling-case-side contact area) between the cooling case surrounding the opening for contact cooling and the reverse surface of the substrate. The gap in communication with the exterior is used to release a liquid if a seal is damaged.

The power inverter uses a configuration in which the cooling case and the circuit substrate are clamped together by bolts extending from the circuit substrate side. Thus, disadvantageously, the individual bolts must be sealed and if the sealed portions of the bolts are degraded, the liquid may leak to the circuit substrate side from the degraded sealed portions.

To solve this disadvantage, the circuit substrate and the cooling case (a heat sink) may be joined or integrated with each other. In this case, however, if the circuit is to be replaced due to defect thereof, it must be disassembled and dismantled together with the cooling case (heat sink). Thus, a new problem arises particularly with a power inverter for a hybrid vehicle using one enclosure to house a plurality of circuits; that is, maintenance for such a power inverter is difficult.

OBJECT AND SUMMARY OF THE INVENTION

It is an object of the present invention to provide a power inverter that has an excellent cooling performance, prevents leakage, and allows size reduction of the apparatus and easy maintenance.

The above object is attained by a power inverter in which a plurality of power inverting semiconductor elements and exothermic electric parts are provided on insulated substrates, the insulated substrates are joined to a cooling plate (cooling substrate) constituting a lower lid of a case for accommodating the insulated substrates, an upper lid of the case is fixed to the cooling plate with screws or the like to constitute a power module, a heat sink having an opening is arranged in contact with a bottom surface of the cooling plate, a first seal portion is provided outside the opening and a groove is formed outside the first seal portion and in an outer wall of the heat sink, holes are formed in the groove at a plurality of locations so as to communicate with an outer surface side of the heat sink, and the heat sink and the cooling plate are clamped together outside the upper lid of the case and outside the groove formed in the heat sink.

DESCRIPTION OF THE EMBODIMENTS

Embodiments of the present invention will be described hereinafter with reference to FIGS. 1 to 11.

Figure 11:
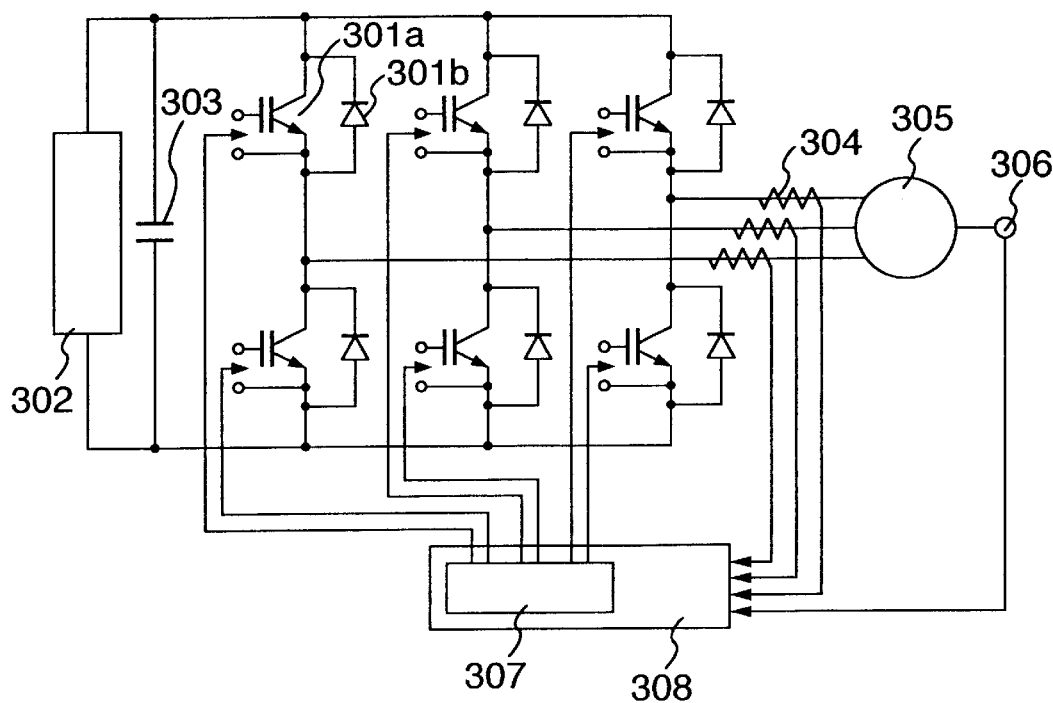
FIG. 11 is a main circuit diagram of a drive system to which the present invention is applied.

First, the functions of a power inverter according to the present invention will be described With reference to FIG. 11. FIG. 11 shows the configuration of a drive system of an electric car in a circuit diagram principally showing the power inverter.

The power inverter of this embodiment uses an Inverter circuit to invert a DC current from a battery 5 302 into an alternate current of variable voltage and frequency to control a three-phase AC electric motor 305 to thereby drive wheels of the vehicle (not shown). The inverter circuit has a filter capacitor 303 connected to a DC side thereof to remove ripple components from a DC current from the battery 302. Additionally, the inverter circuit comprises power semiconductor elements such as a semiconductor switching element 301a, for example, an IGBT, and an inverse parallel diode 301b. The inverter circuit outputs a PWM-modulated three-phase alternating current of variable voltage and frequency from an input direct current by outputting a pulse having three levels, that is, positive, negative, and neutral levels. The electric motor 305 has its rotation controlled when an alternating current of variable voltage and frequency is input thereto and the rotation is transmitted to the wheels for power running of the automobile. Additionally, during a regeneration period when the electric motor 305 is operated as a generator, contrary to the power running, energy flows to the battery 302.

A microcomputer control circuit 308 PWM controls a power supply to the electric motor 305 by using a current sensor 304 and an encoder 306 to detect. an output torque from the electric motor 305 and a rotation speed thereof and calculating these values to control a gate circuit 307 for an IGBT 301. In the PWM control of this embodiment, a carrier frequency is set at about 10 kHz to prevent operational sounds of the inverter from becoming noise.

In the above described power inverter, the main exothermic electric parts are the semiconductor switching element 301a and the inverse parallel diode 301b, the sizes of which depend chiefly on the cooling performance. That is, semiconductor elements and modules must be maintained at a fixed temperature or lower in order to ensure operations of the elements or make them reliable by, for example, preventing module structures from being destroyed due to thermal fatigue. Thus, a liquid cooling structure which has a high cooling performance is employed to increase an amount of power that can be processed by the semiconductor elements. That is, an amount of power processed by the semiconductor elements per unit volume increases to correspondingly allow the size of the semiconductor elements to be reduced.

On the other hand, in a case where a power inverter of such liquid cooling type is mounted in the vehicle, If electric parts in the power inverter get wet with a leaking liquid, not only the apparatus may be hindered from functioning but its components may also be destroyed or made inoperative due to a short circuit or an improper insulation. As a result, the parts must be replaced with new ones or high costs are required for repairs. Furthermore, from the viewpoint of the safety of the occupants in the vehicle, the possibility of giving an electric shock to the occupants must sufficiently be excluded. Therefore, the electric parts of the power inverter of the liquid cooling type must each employ a structure that is as unlikely to get wet as possible.

The power inverter according to embodiments of the invention described hereinafter can meet these requirements.

Figure 1:
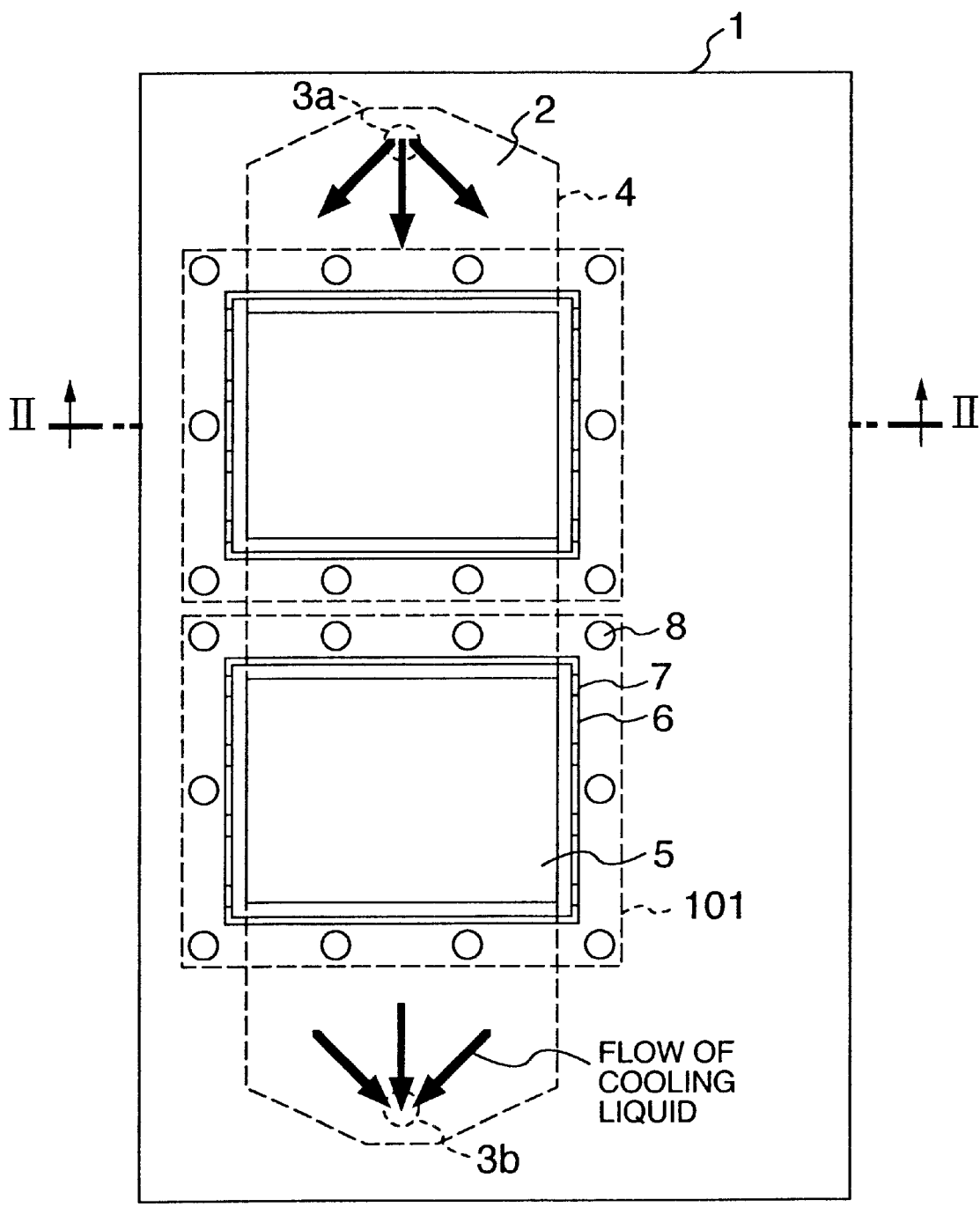
FIG. 1 is a view showing a configuration of a cooling section of a power inverter module according to a first embodiment of the present invention.
Figure 2:
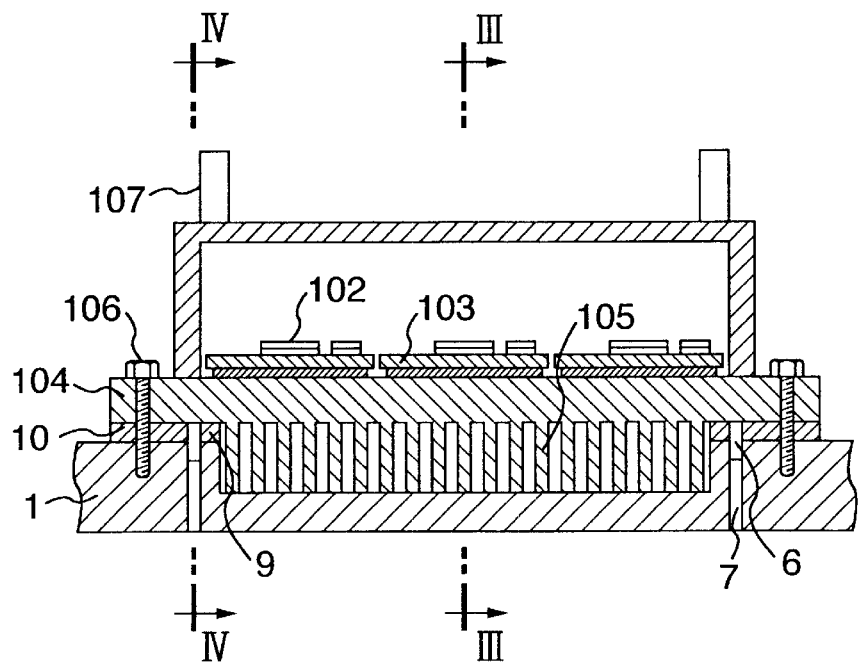
FIG. 2 is a sectional view taken along a line II—II in FIG. 1.
Figure 3:
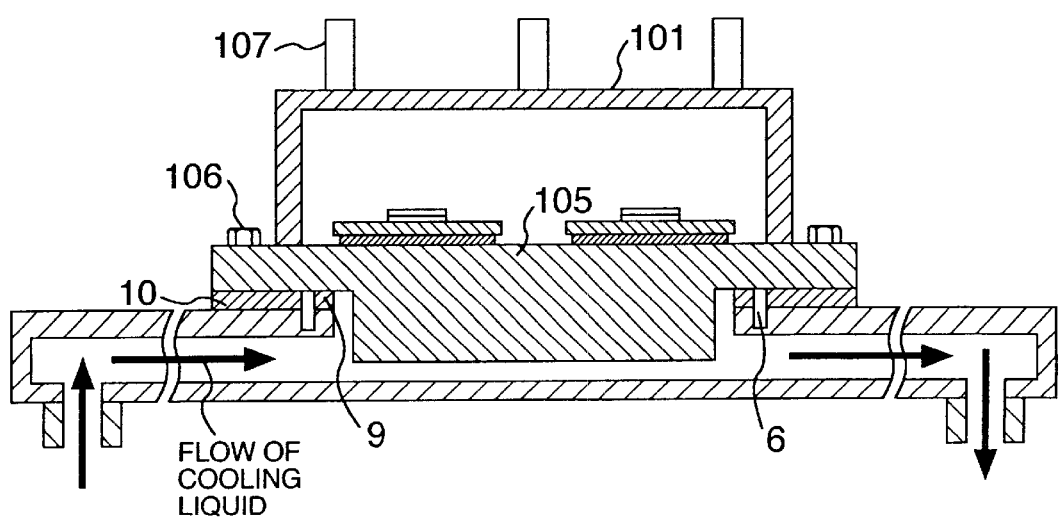
FIG. 3 is a sectional view taken along a line III—III in FIG. 2.
Figure 4:
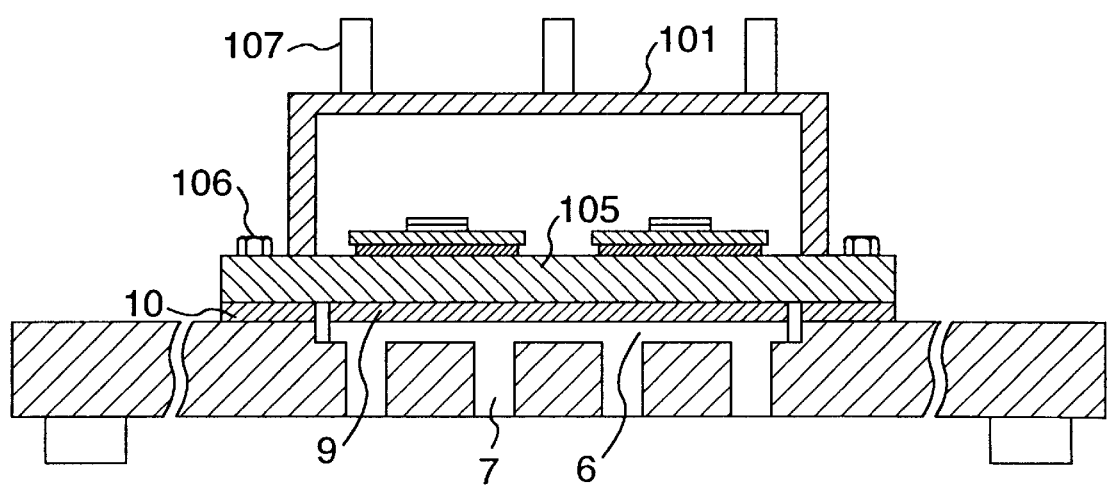
FIG. 4 is a sectional view taken along a line IV—IV in FIG. 2.

A first embodiment of the power inverter of the present invention will be described with reference to FIGS. 1 to 4. FIG. 1 is a view showing a configuration of a cooling section of a power inverter module according to a first embodiment of the present invention. FIG. 2 is a sectional view taken along a line II—II in FIG. 1. FIG. 3 is a sectional view taken along a line III—III in FIG. 2. FIG. 4 is a sectional view taken along a line IV—IV in FIG. 2.

This embodiment shows a power inverter for a hybrid vehicle and shows an example of a case where two respectively independent inverter circuits are mounted to control two revolving electric apparatus. These drawings principally show semiconductor modules and heat sinks (cooling cases or substrates) for cooling the semiconductor modules and omit description of other electric parts such as a capacitor and a microcomputer control circuit, wiring, and parts. electric parts such as a capacitor and a microcomputer control circuit, wiring, and others.

First, the configuration of this embodiment will be described. The semiconductor module comprises semiconductor elements 102 and other electric-circuit parts mounted on insulated substrates 103. Furthermore, the insulated substrates 103 are attached on a radiating plate 104. An upper lid 101 of a circuit case for accommodating the insulated substrates 103 on which the semiconductor elements 102 and the like are mounted is fixed to the radiating plate 104 (radiating plate) with bolts or the like. That is, the upper lid 101 and the radiating plate 104 form the circuit case. The radiating plate 104 has a plurality of through holes for bolt clamping formed in a frame portion thereof (that is, on the radiating plate and outside the upper lid). Bolts 106 are inserted into the through holes to clamp the semiconductor modules and a heat sink 1 (cooling case) together through seals, described later. In addition, the radiating plate 104 has radiating fins 105 arranged in parallel with a flowing direction of a cooling liquid to increase a contact area against the cooling liquid to improve the cooling capability. Further, electrodes 107 used to connect the semiconductor modules to other electric parts are provided on the upper lid 101. In these drawings, the wiring between the semiconductor elements and these electrodes is omitted.

The heat sink 1 of this embodiment has two of the above described semiconductor modules mounted thereon (not only two but also one or two or more semiconductor modules may of course be mounted thereon). Each module constitutes an independent inverter circuit. Such a configuration is also applicable to, for example, a case where two modules constitute one inverter circuit to control one large-capacity revolving apparatus. Although not shown, the present heat sink has other electric parts such as a capacitor 303, for example, mounted thereon.

The heat sink 1 of this embodiment has a cooling channel 2 formed therein for passing cooling liquid within one substrate to cool the semiconductor modules. The cooling channel 2 is formed with openings such that the cooling liquid can come into direct contact with the radiating plate 14 for the semiconductor modules or with the plurality of radiating fins 105 provided along the flowing direction of the cooling liquid. The openings 5 are sized to be smaller than dimension of the radiating plate 104 so that the openings 5 are covered by the radiating plate 104 when the radiating plate 104 is mounted on the heat sink 1. In addition, an inlet 3a and an outlet 3b are formed at opposite ends of the cooling channel 2 on a rear surface of the heat sink 1 opposite to the openings 5 to introduce and discharge the cooling liquid from and to an exterior of the heat sink 1. The inlet 3a and outlet 3b for the cooling liquid may of course be formed at an end surface of the heat sink 1. Furthermore, the heat sink 1 has a plurality of bolt holes 8 arranged outside the openings 5 so as to 5 surround them, in order to fix the radiating plate with the semiconductor modules mounted thereon.

The heat sink also has annular grooves 6 formed in an area of an outer surface thereof (opening side surface) between the openings of the cooling channel and the bolt holes 8. The annular grooves are sized such that the cooling liquid can flow therethrough and are hindered from communicating with the cooling channel 2. Further, the groove 6 has a plurality of holes 7 discretely formed in a bottom surface thereof In communication with a rear surface of the heat sink 1, that is, the surface located opposite the surface on which the semiconductor modules are mounted. In the illustrated embodiment, four of these holes 7 are formed on one side of the groove 6, that is, a total of eight holes 7 are formed in each groove. When the grooves 6 are thus formed, the contact area between the radiating plate 104 for the semiconductor modules and the heat sink 1 is divided into an Inner contact area from the opening 5 to an inner periphery of the groove 6, and an outer contact area from an outer periphery of the groove 6 to an outer periphery of the radiating plate 104.

Seals for maintaining liquid tightness are respectively interposed between the radiating plates 104 and the heat sink 1. Specifically, a first seal is disposed in the inner contact area from the opening 5 and the inner periphery of the groove 6, so that a first seal portion 9 is formed. A second seal is disposed in the outer contact area from the outer periphery of the groove 6 and the outer periphery of the radiating plate 104, so that a second seal portion 10 is formed. These seals may comprise, for example, solid or liquid gaskets composed of laminated or combined rubber, compounds, metal, or O rings. In addition, for easy installation, these two seals may be partly coupled together into one gasket, which may then be inserted between the heat sink 1 and the radiating plate 104.

In this embodiment, the radiating plate of the semiconductor module is clamped, outside the circuit case, to the heat sink having the channel for cooling liquid, without providing any clamping means inside the circuit case accommodating the semiconductor elements and others.

Next, the operation of the above-described configuration of this embodiment will be described. It is in the inner contact areas that liquid tightness is most difficult to obtain. Thus, the first seal is disposed in the inner contact areas and is forcedly brought into contact therewith to obtain liquid tightness. If, however, a pressure larger than a permissible design value is effected on the heat sink and the semiconductor modules due to degradation of the durability of the seals, a decrease in the urging force of the bolts caused by their loosening, or external factors, the liquid may leak from the first seal portions.

Thus, the behavior of the cooling liquid leaking effected if the first seal portion can no longer maintain liquid tightness for any reason will be described. The cooling liquid having leaked to an outside of the first seal portion 9 first flows into the annular groove 6 located outside the first seal. The groove 6 has the holes 7 formed therein and the holes 7 lead to an exterior of the heat sink 1 and are opened to atmospheric pressure. Accordingly, even if a large amount of cooling liquid leaks out of the first seal portion 9, the pressure of the leaked liquid is lower than that can be permitted (sealed) by the second seal portion 10. Therefore, the cooling liquid having flowed into the groove 6 is finally discharged via the holes 7 to an exterior of the heat sink 1, specifically, from the surface of the radiating plate 104 which is located opposite its semiconductor element mounting surface. Thus, portions of the semiconductor modules other than the radiating plates do not receive the liquid. That is, the electric parts mounted on the surfaces of the radiating plates of the semiconductor modules do not get wet.

The most important points of the configuration and operation of this embodiment are that the outside of the semiconductor modules has the function of keeping the cooling channel liquid tight and the function of fixing the semiconductor modules to the heat sink 1 without providing any means for fixing to the heat sink 1 inside the circuit case of the semiconductor modules. Accordingly, the possibility that the cooling liquid leaks into the circuit cases of the semiconductor modules through the bolt holes are perfectly diminished. Furthermore, since the holes 7 leading to the outside of the heat sink 1 are discretely formed in the bottom of the groove 6, rigidity of the heat sink is not reduced, so that the essential sealing performance is not reduced. Moreover, the holes 7 are formed only in the flowing direction of the cooling channel 2 to eliminate the need to provide in the cooling channel pillars required to form liquid relieving holes, which may hinder the flow. Accordingly, the resistance in the cooling channel is not increased, so that it is possible to increase the flow rate of the cooling liquid, thereby contributing to improving the cooling performance.

Figure 5:
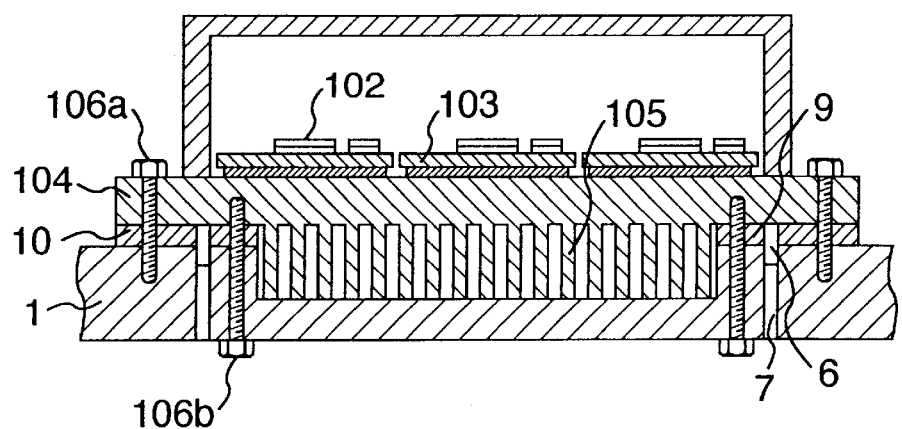
FIG. 5 is a view showing a configuration of a cooling section of a power inverter module according to a second embodiment of the present invention.

Next, a second embodiment of the power inverter of the present invention will be described with reference to FIG. 5. FIG. 5 is a sectional view of cooling structure for the semiconductor modules.

This embodiment differs from the first embodiment in that clamping bolts 106b are provided in the pressure contact areas of the first seal portion 9. It should be noted that for the clamping bolts in the first seal portion 9, through-holes are formed in the heat sink 1, while internal thread holes are formed in the radiating plate 104 but processed so as not to penetrate through the substrate into the case for the semiconductor modules. These bolts chiefly serve to obtain an appropriate surface pressure in the pressure contact areas of the first seal portion and to improve the distribution of surface pressure, thereby further improving the sealing performance. In addition, since the internal thread holes do not penetrate the radiating plate 104, the possibility that the liquid will leak into the semiconductor modules is eliminated.

Figure 6:
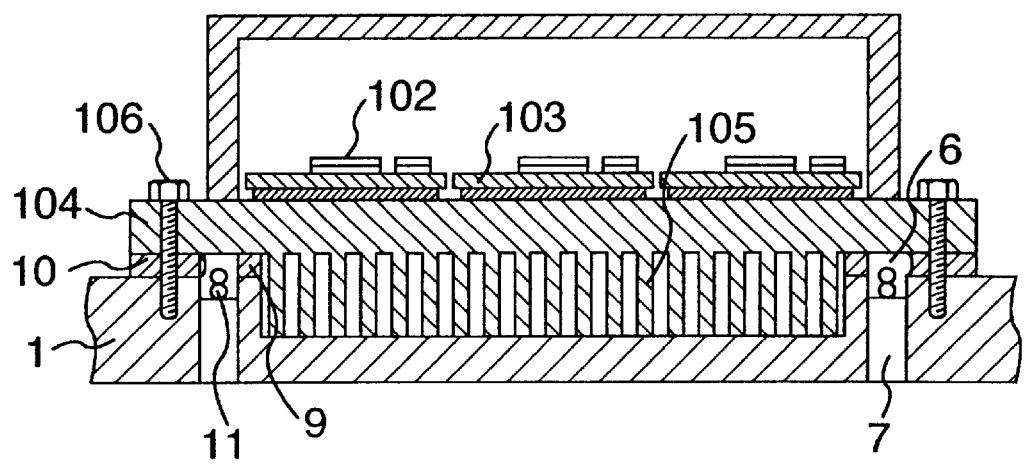
FIG. 6 is a view showing a configuration of a cooling section of a power inverter module according to a third embodiment of the present invention.

A third embodiment of the power inverter of the present invention will be described with reference to FIG. 6. FIG. 6 is a sectional view of cooling structure for the semiconductor module.

This embodiment differs from the first embodiment in that leakage sensors 11 are provided in each groove 6. The leakage sensors 11 detect leakage to issue, for example, an alarm signal to a driver or stop the operation of the power inverter. Also in this case, in order to prevent the pressure of the liquid from being applied to the second seal portion, the groove 6 also has the holes 7 discretely provided at the bottom of the grooves 6, which are in communication with an atmosphere outside the apparatus. With this configuration, it is possible to protect the power inverter before the adverse effects of a failure or the like resulting from the leakage propagate to other parts.

Figure 7:
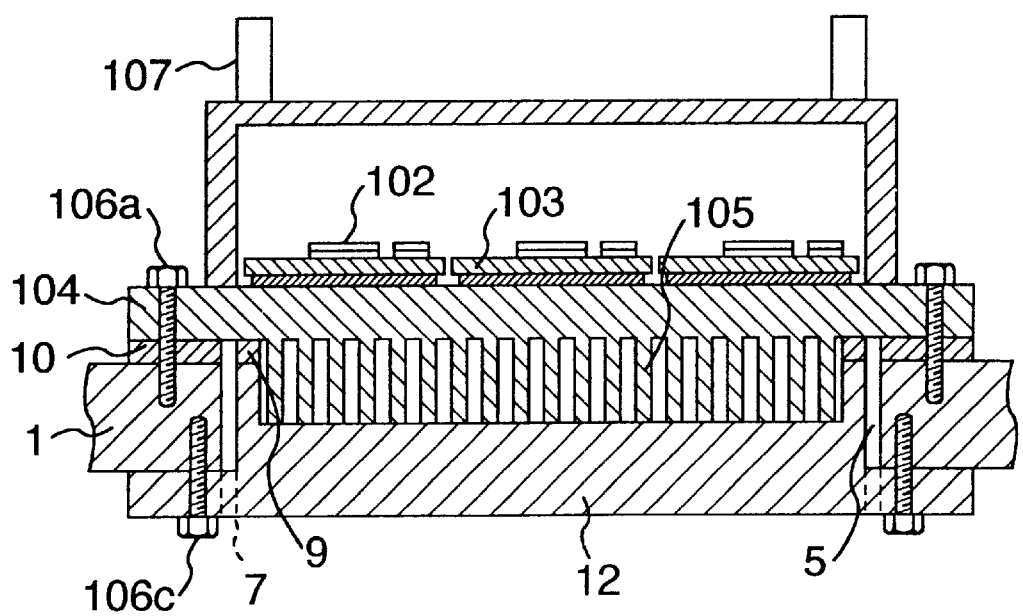
FIG. 7 is a view showing a configuration of a cooling section of a power inverter module according to a fourth embodiment of the present invention.

Next, a fourth embodiment of the power inverter of the present invention will be described with reference to FIG. 7. FIG. 7 is a sectional view of cooling section for semiconductor module.

In this embodiment, a heat sink cover 12 having a cooling channel constructed therein is provided. A space corresponding to an area surrounded by the outer peripheries of the grooves in the first embodiment is formed in the heat sink 1. The heat sink cover 12 is inserted in the space so as to form grooves corresponding to the grooves 6 of the first embodiment between the heat sink 1 and the heat sink cover 12. Additionally, the holes corresponding to the holes 7 of the first embodiment are discretely formed at the heat sink cover 12. Alternatively, the function of the holes 7 can be achieved without providing any special liquid-tightness maintaining means in a contact surface between the heat sink 1 and the heat sink cover 12. The heat sink cover 12, constituting the cooling channel, is fixed on the heat sink 1 by means of clamping means such as bolts from the rear side of the heat sink cover, and bolt holes therefor are formed so as not to penetrate the radiating plate 104. This configuration has advantages to eliminate the possibility of causing the mounting surface of the semiconductor module to get wet and to omit working for forming the grooves. In addition, in this embodiment, the radiating plate is clamped to the heat sink 1 outside the circuit case for housing the semiconductor modules, as in the first embodiment.

Figure 8:
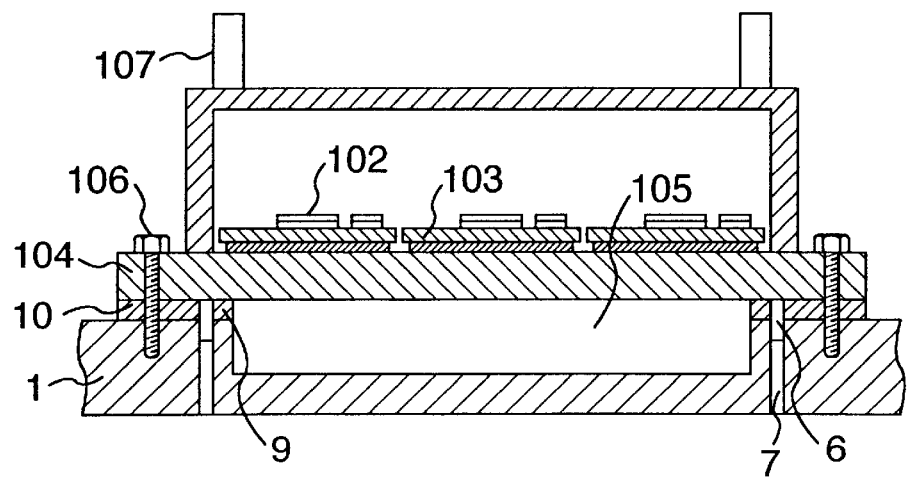
FIG. 8 is a view showing a configuration of a cooling section of a power inverter module according to a fifth embodiment of the present invention.

Next, a fifth embodiment of the power inverter of the present invention will be described with reference to FIG. 8. FIG. 8 is a sectional view of cooling section for semiconductor module.

The fifth embodiment differs from the first embodiment in that that surface of the radiating plate 104 for the semiconductor modules, which comes into contact with the cooling liquid is smoothed. That is, the embodiment is suitable for a case in which a direct liquid cooling is used for conventional semiconductor modules of a type mounted on the heat sink via grease or the like. In general, a method for mounting such semiconductor modules comprises forming bolt holes in an outer edge of each module as in this embodiment. Accordingly, the sealing manner according to the present invention functions effectively if such conventional semiconductor modules are directly cooled with a liquid. That is, the cooling performance can be improved without specializing the semiconductor modules for the direct liquid cooling type, thereby contributing to reducing module costs.

Figure 9:
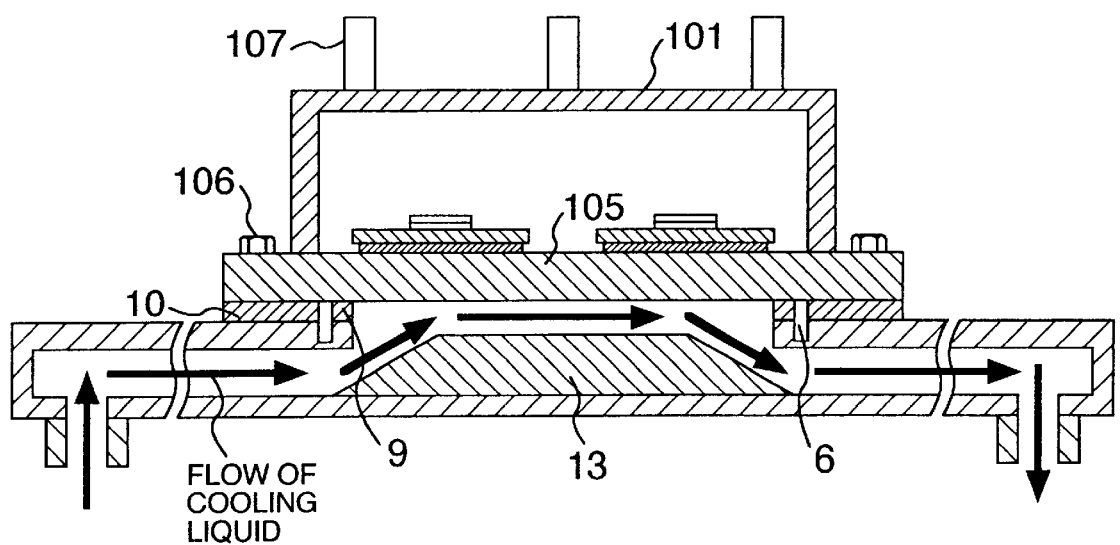
FIG. 9 is a view showing a configuration of a cooling section of a power inverter module according to a sixth embodiment of the present invention.

A sixth embodiment of the power inverter of the present invention will be described with reference to FIG. 9. FIG. 9 is a sectional view of cooling section for semiconductor module.

In the embodiment shown in FIG. 9, in addition to the structure of the embodiment shown in FIG. 8 in which the liquid contact section is smoothed, a bottom surface of the opening in the heat sink is located closer to the radiating plate to increase a flow velocity of the cooling liquid in order to further improve the cooling performance. That is, in the embodiment shown in FIG. 8, the opening must have a fixed thickness to allow the groove 6 to be formed in the heat sink 1, so that a flow passage cross section of the opening may increase to reduce the flow velocity to thereby locally degrade the cooling performance. To solve this problem, in the embodiment shown in FIG. 9, a spacer 13 is provided for smoothly reducing the flow passage cross section so that the flow passage cross section directly below the openings 5 can decrease gradually to increase the flow velocity while minimizing an increase in pressure loss, thereby further improving the cooling performance.

Figure 10:
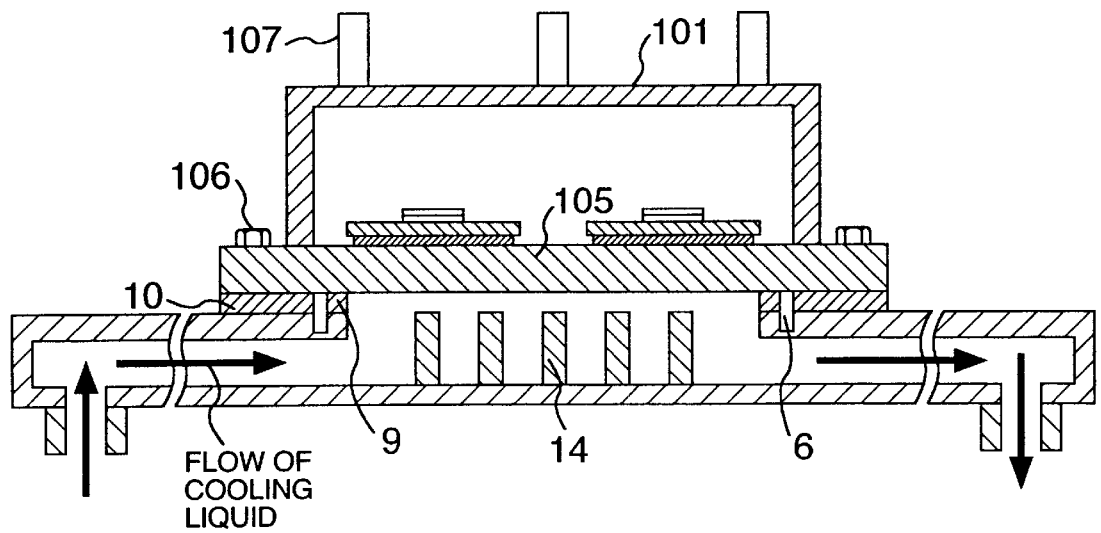
FIG. 10 is a view showing a configuration of a cooling section of a power inverter module according to a seventh embodiment of the present invention.

A seventh embodiment of the power inverter of the present invention will be described with reference to FIG. 10. FIG. 10 is a sectional view of cooling section for semiconductor module.

In the embodiment shown in FIG. 10, in addition to the embodiment shown in FIG. 8, a plurality of projections are provided in the heat sink near the openings. The projections disturb the flow of the cooling liquid immediately below the openings 5 to facilitate heat transmission. That is, the projections form a disturbance facilitator. This disturbance facilitator may comprise an object such as a group of cylinders or prisms or a wing-shaped spacer, for example, which disturb a boundary phase formed on the surface of the radiating plate 104. This has an effect of enabling the cooling performance to be further improved without using semiconductor modules specialized for the direct liquid cooling method, thereby contributing to reducing module costs.

In the above embodiments, the grooves 6 are respectively provided so as to surround respective semiconductor modules. The invention, however, is not limited to this structure. The following structure may be used. A plurality of semiconductor modules are mounted on one radiating plate, and openings 5 are provided in a heat sink 1 at locations corresponding to the plurality of semiconductor modules. The one radiating plate is fixed to the heat sink by means of fastener such as bolts at outer periphery portions (frame) thereof. One annular groove is formed in the heat sink so as to surround all of the semiconductor modules.

According to the power inverter of the present invention, the radiating plate for the semiconductor modules can be brought into direct contact with the cooling liquid and the possibility of causing the electric parts mounted in the semiconductor modules to get wet can be eliminated, thereby providing a very reliable power inverter having a high cooling performance.

What is claimed is:

1. A power inverter, comprising:

at least one semiconductor module having a plurality of power inverting semiconductor elements mounted therein; and a cooling case containing a cooling liquid for cooling said at least one semiconductor module, wherein said at least one semiconductor module comprises a semiconductor element and an electric circuit on a radiating plate, and an upper case containing said semiconductor elements and electric circuits is provided on said radiating plate, and said cooling case has a cooling channel in which the cooling liquid flows and at least one opening for bring said radiating plate in contact with the cooling liquid flowing in said cooling channel, and a first seal portion is provided at a circumference of said at least one opening, and an annular groove is formed at a circumference of said first seal portion, and at least one liquid relieving hole is formed in said annular groove, said hole leading from said groove to a surface of the cooling case other than the surface of the cooling case in contact with said radiating plate;

wherein means for clamping said radiating plate and said cooling case together is provided outside said groove and outside said upper case, and wherein a second seal portion is provided outside said groove, and said clamping means is provided inside or outside said second seal portion.

2. By The power inverter according to claim 1, wherein said clamping means comprises a bolt and a threaded bolt hole provided in said radiating plate at said first seal portion, and said threaded bolt hole has a length not extending through said radiating plate.

3. The power inverter according to claim 1, wherein a means for detecting leakage of the cooling liquid is provided in said groove.

4. A power inverter, comprising:

a circuit case accommodating at least on semiconductor module; and a cooling case including at least one opening at a position corresponding to an inner surface of said circuit case so that a surface of the cooling case which is located opposite a semiconductor module mounting surface is in contact with a cooling liquid, wherein a clamping section is provided outside said circuit case and used to clamp said cooling case with bolts; and wherein an annular groove that is not in communication with said at least one opening is formed on an outer peripheral side of said at least one opening in said cooling case.

5. The power inverter according to claim 4, wherein a seal portion is provided between said at least one opening in said cooling case and said groove.

* * * * *